United States Patent
Vahid

(10) Patent No.: US 9,342,109 B2
(45) Date of Patent: *May 17, 2016

(54) ASYMMETRIC COMPUTER TABLET AND DOCKING SYSTEM

(71) Applicant: Javid Vahid, Dana Point, CA (US)

(72) Inventor: Javid Vahid, Dana Point, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/814,260

(22) Filed: Jul. 30, 2015

(65) Prior Publication Data

US 2015/0338884 A1    Nov. 26, 2015

Related U.S. Application Data

(63) Continuation of application No. 13/646,051, filed on Oct. 5, 2012, now Pat. No. 9,125,289.

(51) Int. Cl.
*H05K 7/00*     (2006.01)
*G06F 1/16*     (2006.01)

(52) U.S. Cl.
CPC ............ *G06F 1/1656* (2013.01); *G06F 1/1626* (2013.01)

(58) Field of Classification Search
CPC ........................................................ H05K 7/00
USPC ..................................... 361/686, 679.41, 683
See application file for complete search history.

(56) References Cited

U.S. PATENT DOCUMENTS

| 6,256,192 B1 * | 7/2001 | Shannon ............... G06F 1/1616 |
| | | 312/223.2 |
| 2011/0075349 A1 * | 3/2011 | Ma ........................ G06F 1/1632 |
| | | 361/679.41 |

* cited by examiner

*Primary Examiner* — Dion R Ferguson
*Assistant Examiner* — Mandeep S Buttar
(74) *Attorney, Agent, or Firm* — CIONCA Law Group P.C.; Marin Cionca

(57) ABSTRACT

A system for docking a computer tablet with a docking station. The computer tablet has an asymmetrical edge that is adapted to rest in a cradle portion of the docking station. While resting in the docking station the computer tablet may be rotated to various angles and still maintain electrical connectivity to the docking station.

7 Claims, 11 Drawing Sheets

Fig. 1.G

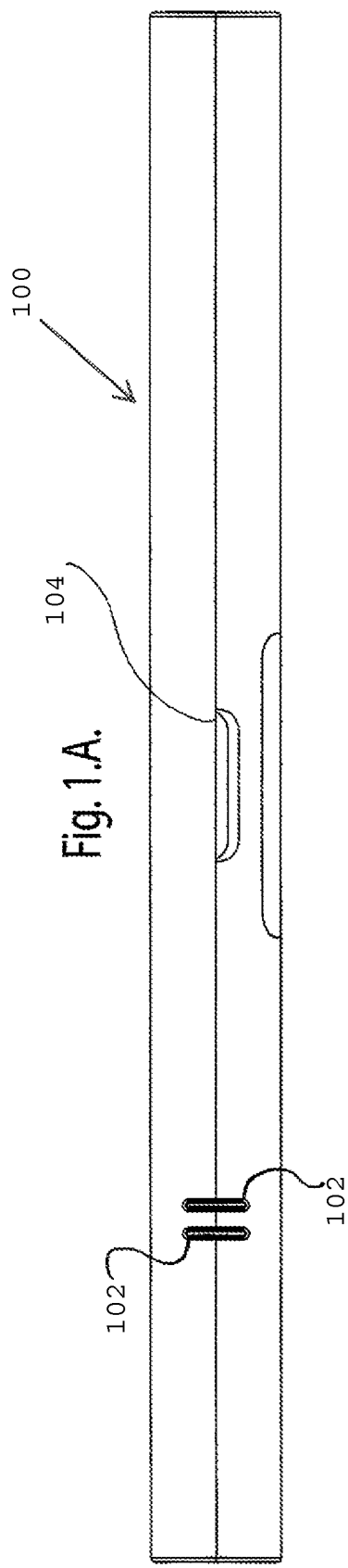
Fig. 1.A.
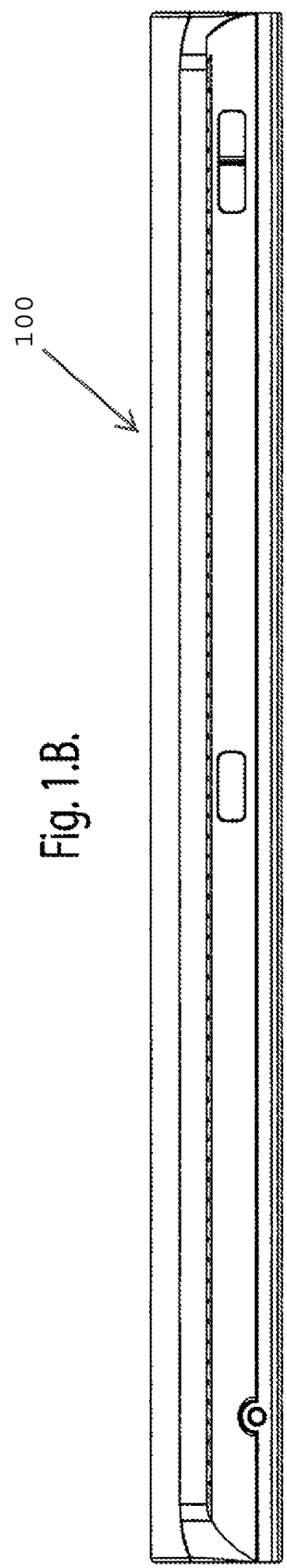
Fig. 1.B.

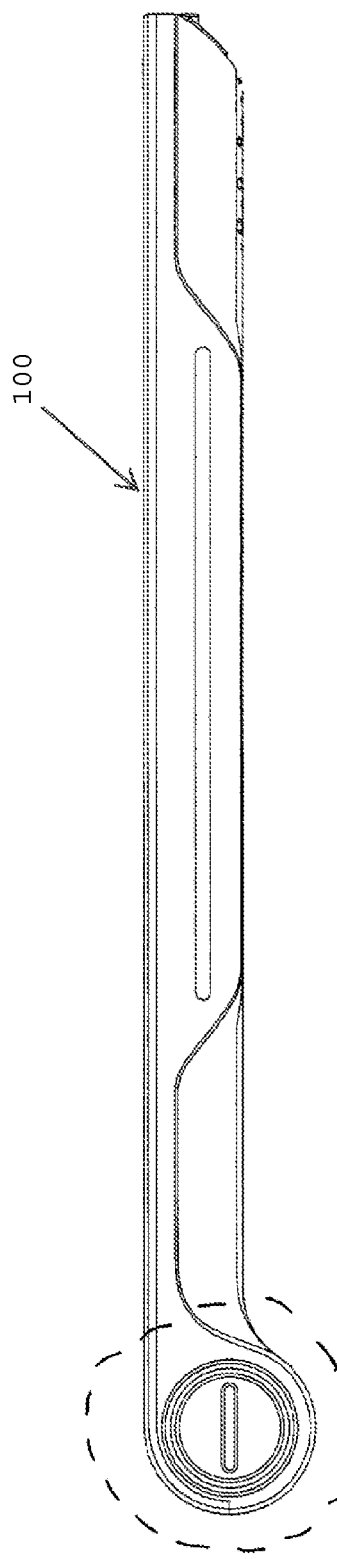
Fig. 1.C.
Fig. 1.G
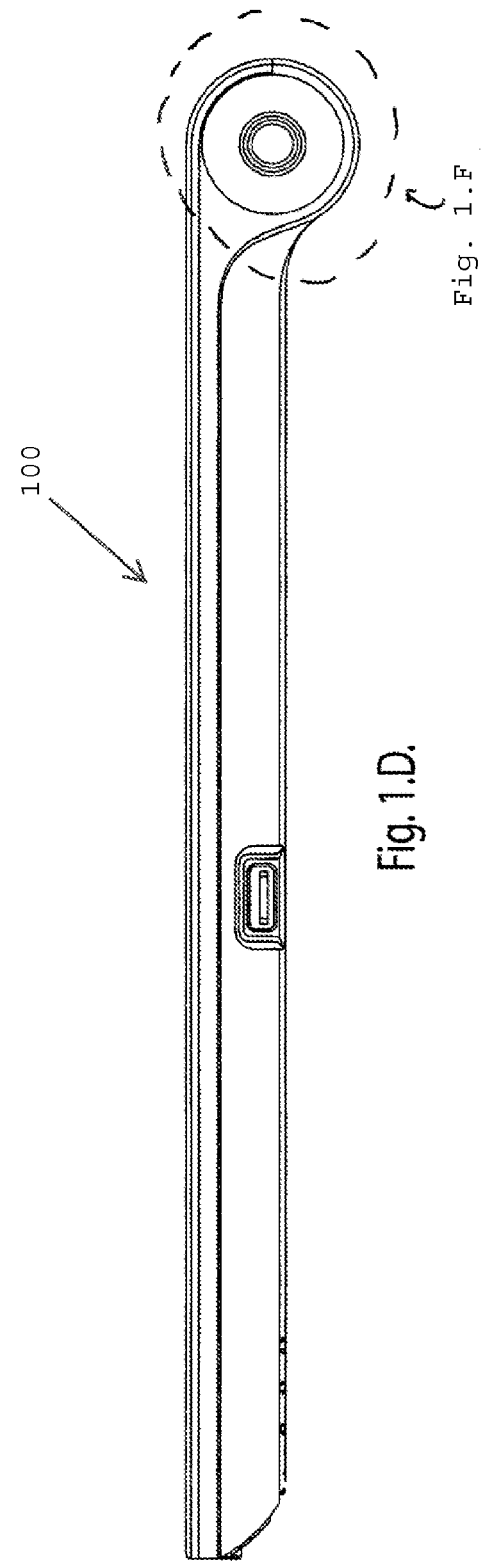
Fig. 1.D.
Fig. 1.F

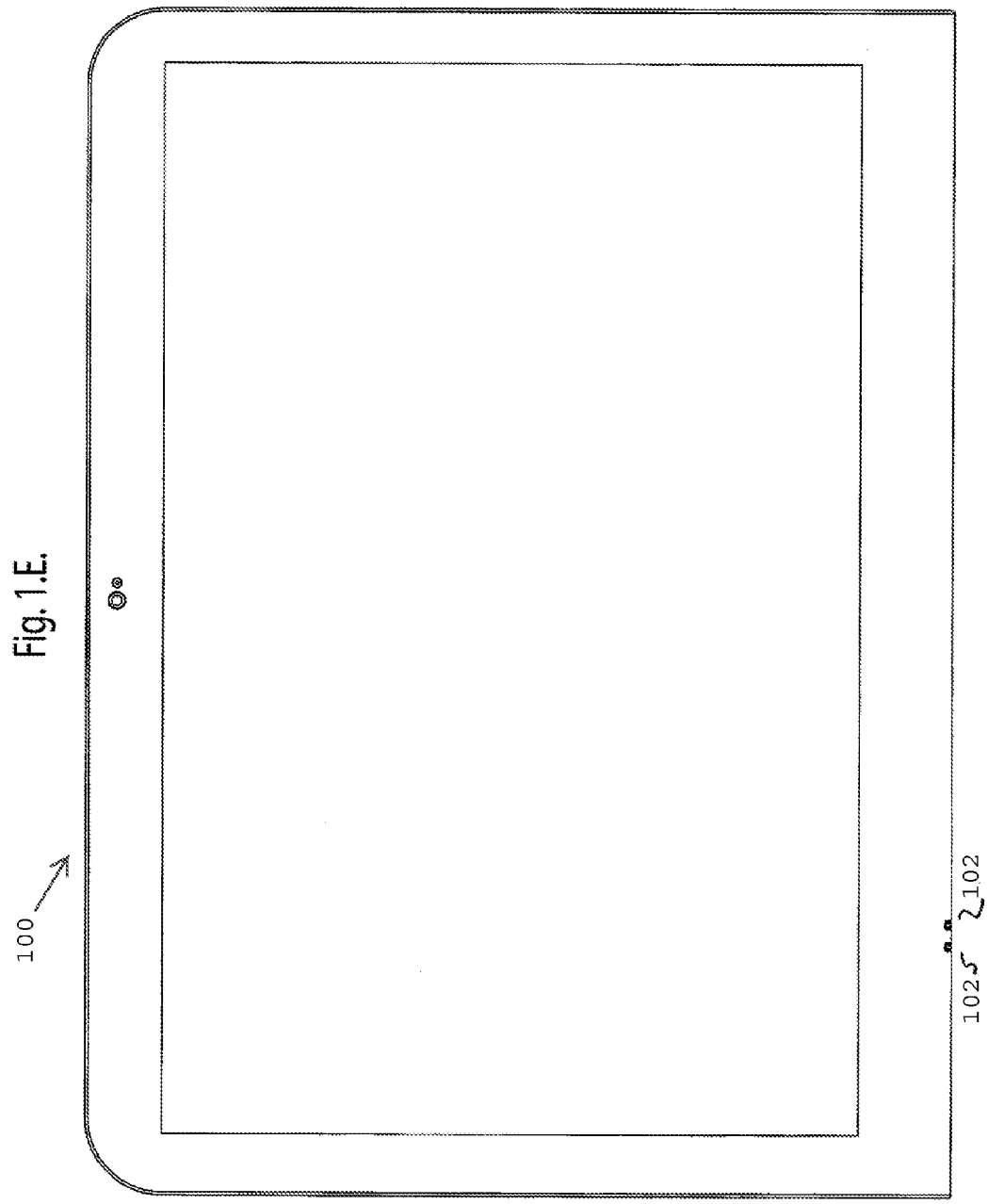

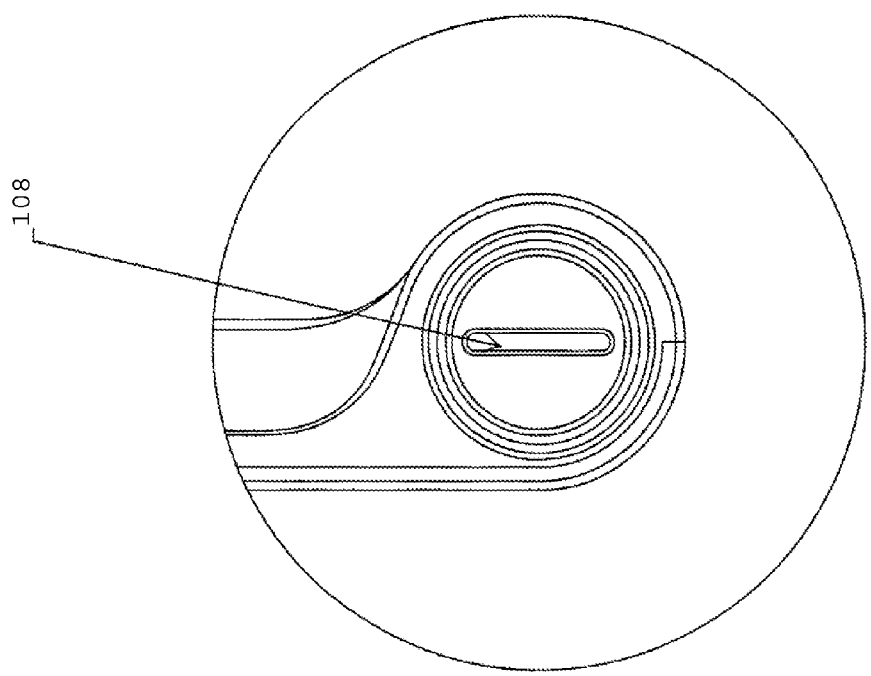
Fig. 1.G.
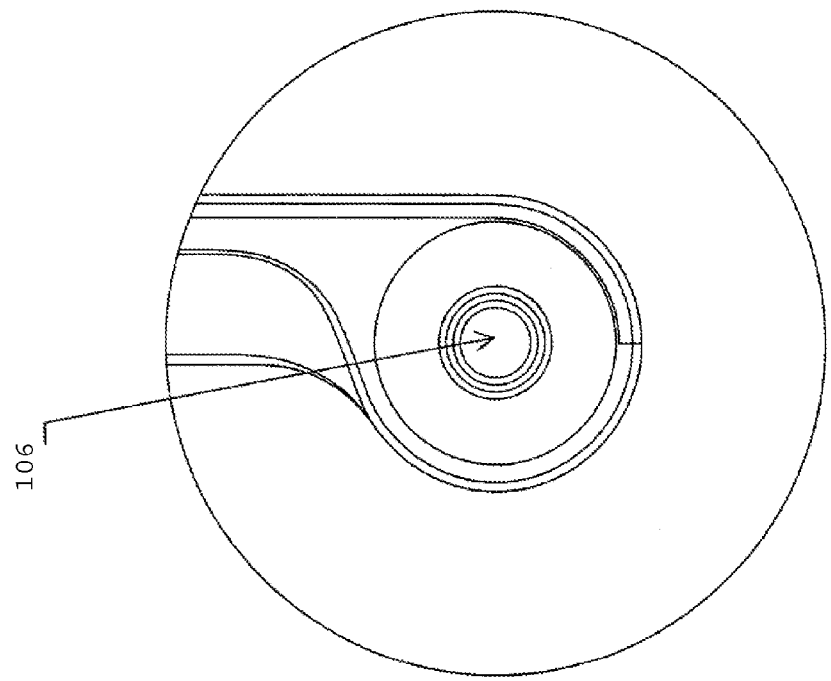
Fig. 1.F.

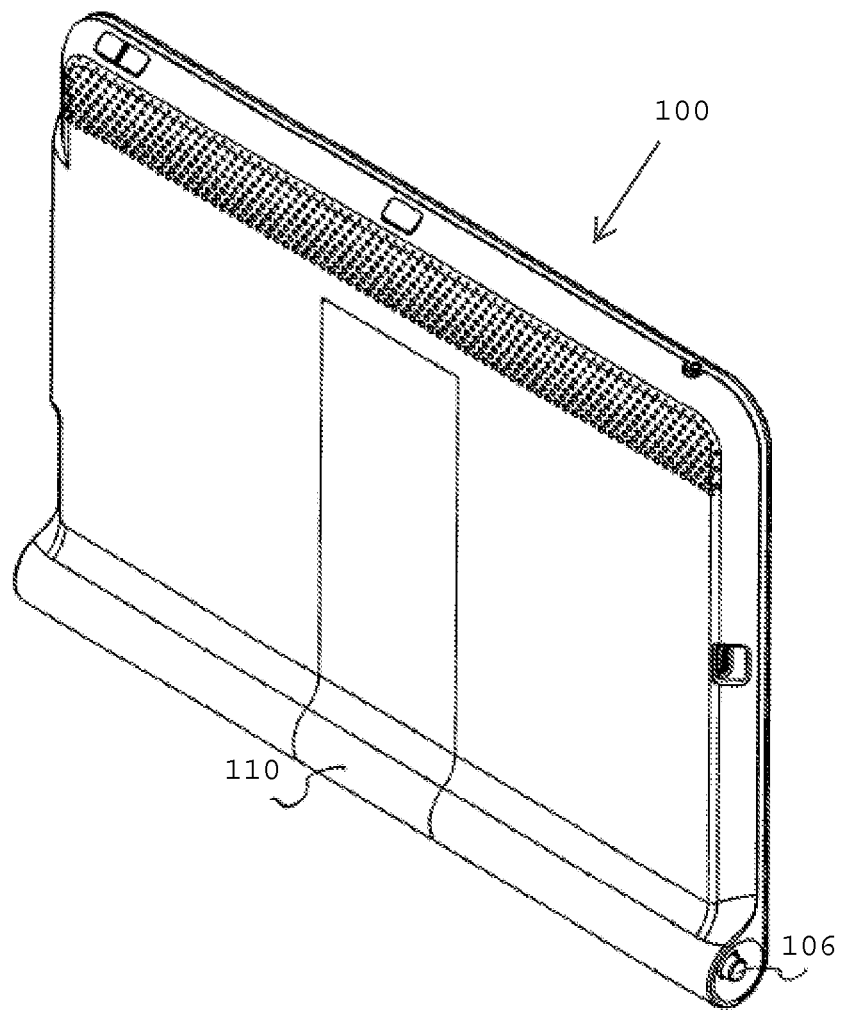
Fig. 1.H.

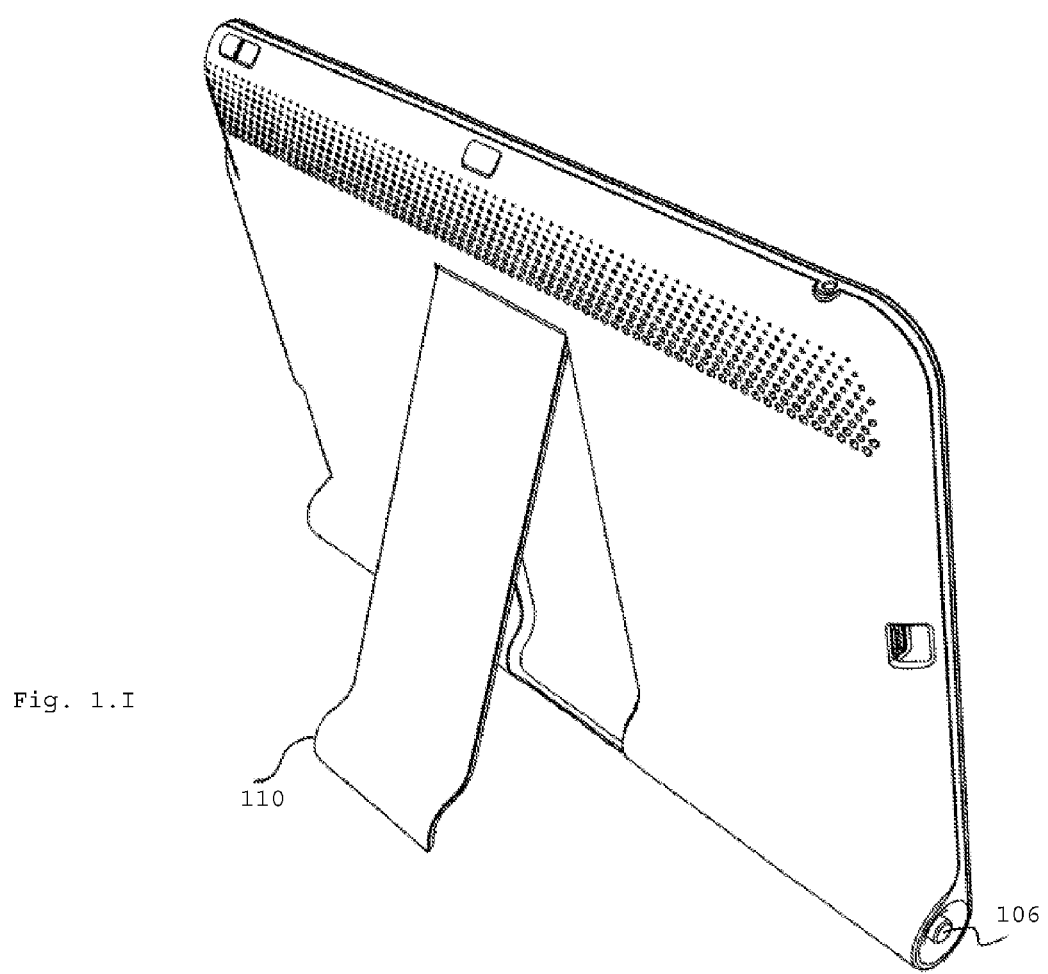
Fig. 1.I

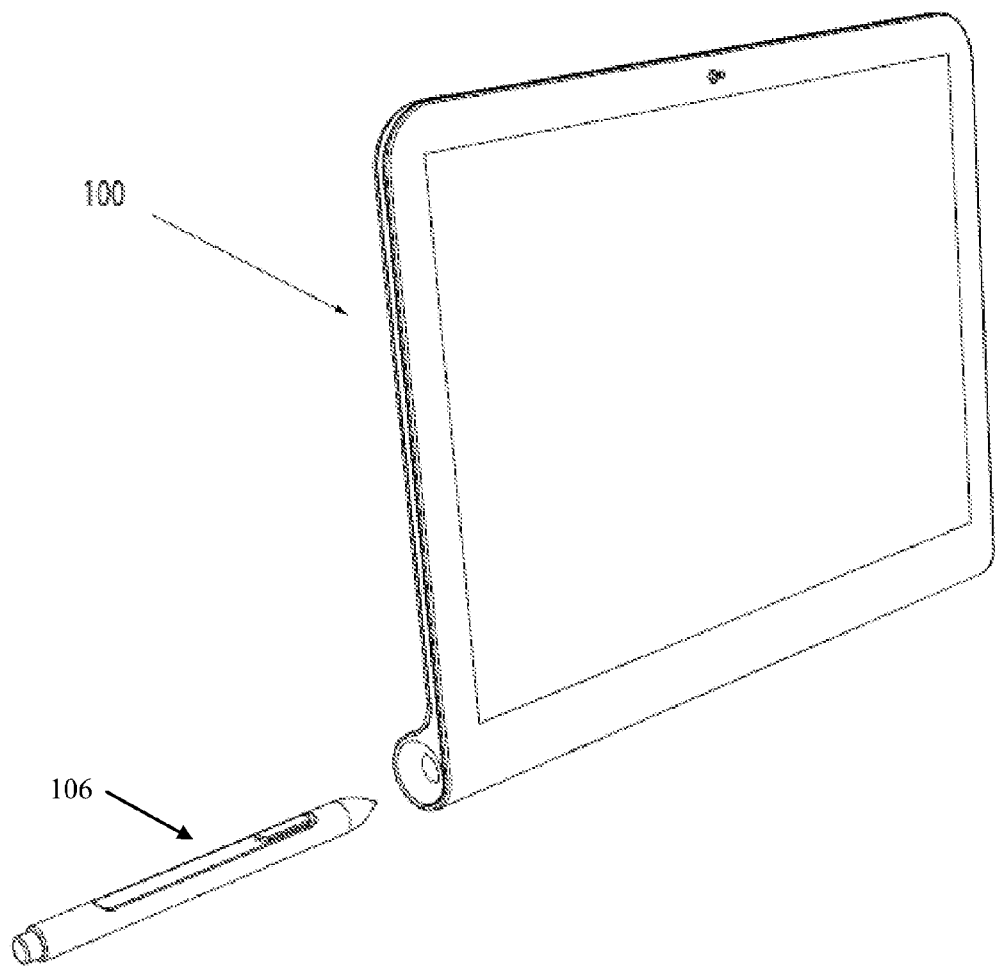
Fig. 1.J

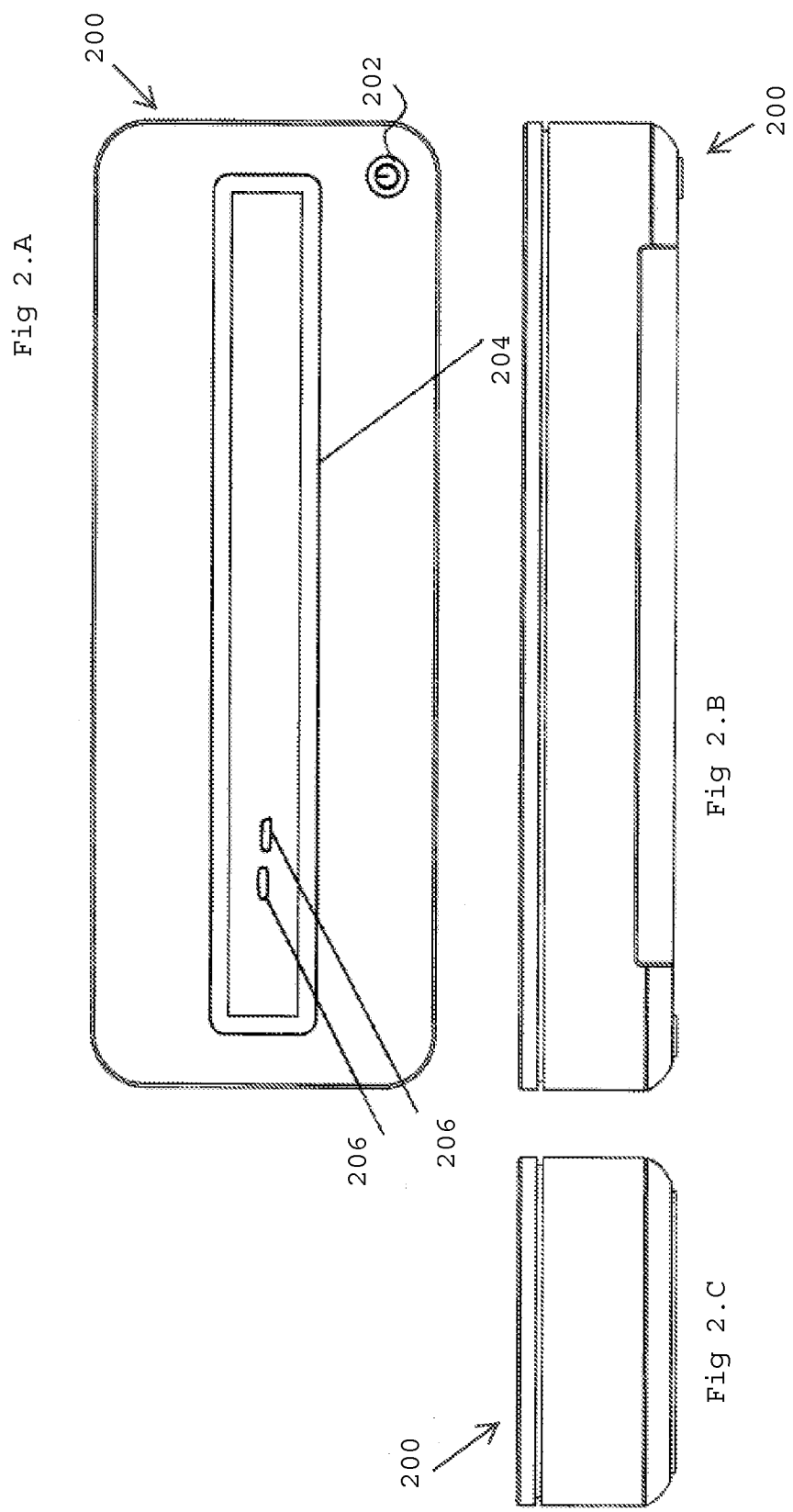

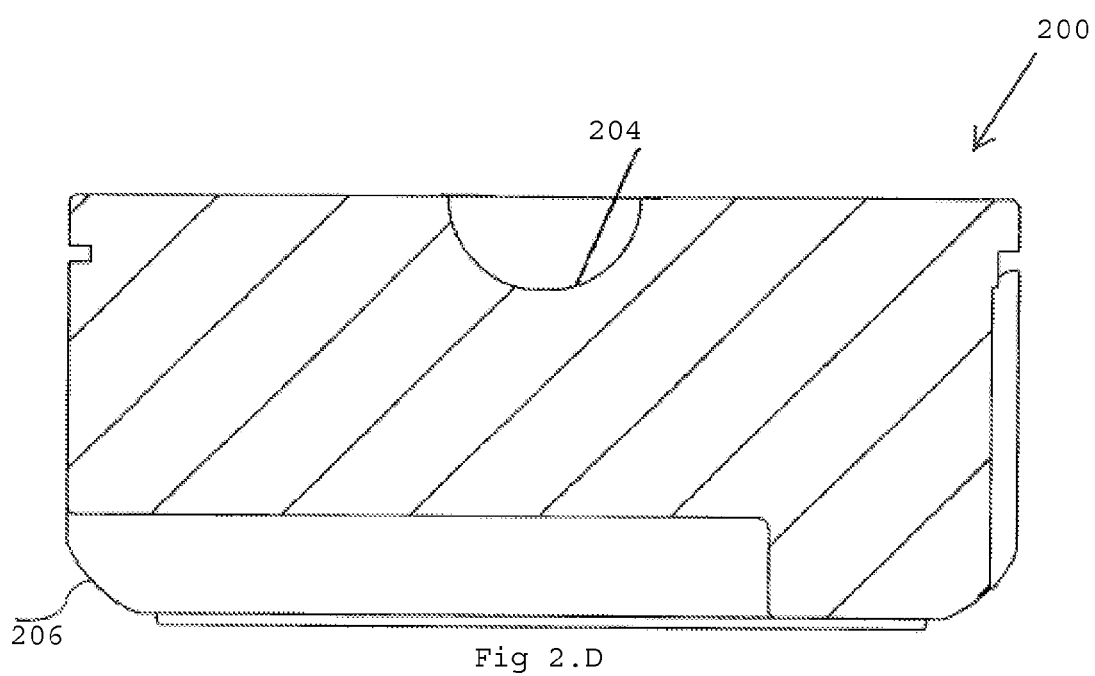
Fig 2.D

ASYMMETRIC COMPUTER TABLET AND DOCKING SYSTEM

CROSS-REFERENCE TO RELATED APPLICATIONS

This application is a continuation and claims the benefit of U.S. Non-Provisional application Ser. No. 13/646,051, filed Oct. 5, 2012, which is hereby incorporated by reference.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Computers have evolved over the last half century, from large VAX style computers that were the size of entire rooms to small smart phone that can fit in a person's pocket. With the advances in technology, other styles of computer have come in to existence. The desktop PC evolved into the portable lap-top and recently evolved again into the computer tablet (e.g. Apple I-Pad™, Samsung Galaxy Tablet™ etc.) Besides the advances in the computer themselves, the peripheral devices (e.g. docking stations, printers, scanners, televisions, etc.) that operate conjunctively with the computers have evolved.

U.S. Pat. No. 7,171,570 to Cox, et al. issued Jan. 30, 2007 and entitled "Method and apparatus for selectively increasing the operating speed of an electronic circuit" discloses a system that facilitates selectively increasing the operating frequency of an electronic circuit, such as a computer system.

U.S. Pat. No. 6,264,484 to Chien et al. issued Jul. 24, 2001 and entitled "Docking Station for a Notebook Computer with a Downwardly Oriented Docking Connector" discloses a docking station adapted for use with a notebook computer with a downwardly oriented docking connector. The top side of the housing of the docking station has an upwardly oriented electrical connector which is adapted for mating with the docking connector in a in a vertical direction. An ejector is mounted in the housing, and is movable upwardly and downwardly for placement and removal of the notebook computer. A rotary shaft is mounted to the housing, and is coupled to the ejector for moving the ejector for placement and removal of the computer in the docking station. An operating member is mounted on the housing, and is coupled to the rotary shaft. The operating member is operable from an exterior of the housing for rotating the rotary shaft.

U.S. Pat. No. 6,583,985 to Nguyen, et al. issued Jun. 24, 2003 and entitled "Elevationally Adjustable Portable Computer Docking Station" discloses a portable computer docking station housing provided on its bottom side with a support foot structure which is pivotable relative to the housing to prop it up on a horizontal work station surface in a selectively variable one of a series of different front-to-rear tilt angles thereon. This permits the opened display screen of a docked portable computer disposed on the top side of the docking station housing to be selectively adjusted upwardly and downwardly in a vertical plane to accommodate the height and viewing preferences of a user of the docked computer. A specially designed spring-loaded, manually operable clutch mechanism is useable to releasably lock the support foot in its selected pivotal orientation relative to the housing. Various peripheral device connection ports are conveniently incorporated in the support foot.

U.S. Pat. No. 6,625,015 to Yin issued Sep. 23, 2003 and entitled "Portable Computer Docking Tray System" discloses a portable computer docking tray system with a docking tray for facilitating securing a portable computer to a docking station. The docking tray is also serves as a compact and light-weight auxiliary power source for the portable computer that may be transported with the portable computer.

U.S. Pat. No. 6,654,826 to Cho, et al. issued Nov. 25, 2003 and entitled "Docking System for a Portable Computer" discloses in a docking system for a portable computer, the bus sharing structure between the portable computer and a docking station and the structure of the docking station are improved so that the real time execution of a program and the sharing of data and peripheral devices are possible. The docking system of the portable computer includes: a docking station including an auxiliary storage device wherein a first operating system is stored, I/O devices, a plurality of extension slots and a plurality of ports, but excluding a microprocessor and a memory; a portable computer including a ROM wherein a second operating system is stored, a microprocessor, a memory wherein commands and data are stored in an electronic manner, and a docking controller for selecting one of the first and second operating systems according to whether or not the portable computer is docked at the docking station; and first and second signal transmitting units provided at the portable computer and the docking station, respectively, for performing transmission and reception of data between the portable computer and the docking station.

U.S. Pat. No. 6,667,881 to Oross issued Dec. 23, 2003 and entitled "Alignment Mechanism for a Computer System having a Portable Computer and a Docking Station" discloses a docking station for a portable computer contains a platform and a movable guide bar connected to the docking station and extending over the platform. The guide bar is capable of guiding the portable computer into proper alignment with the docking station when the portable computer is placed on the guide bar and pressed downwardly into the platform. The guide bar may contain a thermally conductive guide protrusion capable of mating with a heat sink on the portable computer. Heat is transferred from the heat sink on the portable computer to the guide protrusion on the guide bar. The guide bar itself may also be thermally conductive, providing a further avenue for heat to be transferred from the portable computer to the docking station.

U.S. Pat. No. 6,772,265 to Baweja, et al. issued Aug. 3, 2004 and entitled "Docking Station for a Laptop Computer" discloses A laptop computer and a docking station. The laptop computer includes a microprocessor and a first video card in electrical communication with the microprocessor. The docking station includes a projector and a second video card in electrical communication with the projector. Upon a mounting of the laptop on the docking station, an electrical communication is established between the microprocessor and the second video card, and an electrical communication is established between the projector and the first video card. The microprocessor selectively provides control signals to either the first video card or the second video card. The first video card provides video signals to the projector in response to the control signals, and the second video card provides the video signals to the projector in response to the control signals. The projector provides video images in response to the video signals as received from either the first video card or the second video card.

U.S. Pat. No. 6,856,506 to Doherty, et al. issued Feb. 15, 2005 and entitled "Tablet Computing Device with Three-dimensional Docking Support" discloses a tablet computer and a docking station assembly. This docking station comprises a docking assembly for positioning with three degrees of freedom and having a data connector for mechanically supporting and interfacing with the tablet computer. A support member couples the docking assembly to an expansion base. The base includes a number of ports for interfacing with a variety of peripheral devices or power supplies. These varieties of ports mount to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

U.S. Pat. No. 6,914,197 to Doherty, et al. issued Jul. 5, 2005 and entitled "Flexible Circuit Board for Tablet Computing Device" discloses a tablet computer and a docking station assembly. This docking station includes a docking assembly for positioning with three degrees of freedom and having a data connector for mechanically supporting and interfacing with the tablet computer. A support member couples the docking assembly to an expansion base. The base includes a number of ports for interfacing with a variety of peripheral devices or power supplies. These varieties of ports mount to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

U.S. Pat. No. 6,937,468 to Lin, et al. issued Aug. 30, 2005 and entitled "Portable Computer and Portable Docking Station Arrangement" discloses a portable docking station equipped with a keyboard, a swinging bracket pivoted to the portable docking station, and a portable computer insertable into the swinging bracket in one of two reversed directions for enabling the arrangement to be used as a notebook computer or a tablet PC. A spare battery pack is provided at the portable docking station, and chargeable by external power supply upon insertion of the portable computer into the swinging bracket. Data transmission between the portable docking station and the portable computer may be achieved by a wired transmission method or wireless transmission method.

U.S. Pat. No. 7,080,182 to Sims issued Jul. 18, 2006 and entitled "Automatic Tablet Scratch Pad" discloses a method, apparatus, and signal-bearing medium for determining that a tablet electronic device is docked to a docking station. Upon detection, a scratchpad application is started. When a telephone call occurs, a telephone message pad application is started. In this way, an application is automatically selected for the tablet electronic device.

U.S. Pat. No. 7,159,279 to Liu, et al. issued Jan. 9, 2007 and entitled "Pivotal hinge Mechanism Used for Portable Computer" discloses an improved pivotal hinge mechanism used for portable computer equipped with a stopper device which when portable computer and a docking station are joined together shall be actuated by the docking station to prevent the LCD of the portable computer from rotating in left and right direction, so that the collision happened between the docking station and the LCD of the portable computer due to rotation of the LCD relative to the computer mainframe shall be avoided; when the portable computer is disconnected from the docking station said stopper device shall immediately return to the normal position so that the LCD of the portable computer can rotate again in an angle of 0 180 degrees in left and right direction with respect to the computer mainframe.

U.S. Pat. No. 7,209,124 to Hunt, et al. issued Apr. 24, 2007 and entitled "Multiple-Position Docking Station for a Tablet Personal Computer" discloses a multiple-position docking station for a tablet personal computing device. A different mode of operation of the tablet personal computing device is supported by different positions of the docking station. A first mode of operation may be supported when the tablet personal computing device is positioned to extend in a more or less perpendicular direction from a work surface. A second mode of operation may be supported when the tablet personal computing device is positioned so that it extends in a more or less parallel direction with respect to a work surface.

U.S. Pat. No. 7,298,613 to Yin, et al. issued Nov. 20, 2007 and entitled "Portable Computer Docking Station" discloses a portable computer docking station comprising a base and a panel rotatably connected to the base. An angle is formed between the base and the panel. A mounting point is disposed on the panel and provides a releasable connection to an interface assembly that is operable to releasably connect to a portable computer. An adjusting system controls the angle of the panel relative to the base.

U.S. Pat. No. 7,911,779 to Tarnoff issued Mar. 22, 2011 and entitled "Computer Docking Station" discloses a computer docking station provided for supporting and electrically coupling to a portable computer that includes a docking connector and an aperture at least partly defining a carrying handle for the computer. The docking station includes a body with a cradle portion configured to support a portion of the computer and having a connector operable to electrically couple with the docking connector of the computer. The body further includes an arm portion sized and configured to be received in the aperture in the computer. A latching member is coupled with the arm portion and is movable between a first position relative to the arm portion, in which the arm portion can be inserted into or removed from the aperture in the portable computer, and a second position relative to the arm portion, in which the arm portion cannot be removed from the aperture in the portable computer.

U.S. Pat. No. 7,940,522 to Solomon, et al. issued May 10, 2011 and entitled "Portable Computer Docking Station" discloses a cradle coupled to a docking base where the cradle is adapted to receive a portable computer. The docking station also comprises a wireless receiver adapted to communicate a wireless input signal received by the docking station to the portable computer.

U.S. Pat. No. 7,949,797 to Yan, et al. issued May 24, 2011 and entitled "Computer Docking Station and Switching Method thereof" discloses a computer docking station and a switching method thereof. The method comprises: monitoring whether a wired input/output module is connected to a host computer, and outputting a monitoring result; controlling a first data processing module to be connected to the wired input/output module when the monitoring result indicates that the wired input/output module is connected to the host computer, or otherwise controlling the first data processing module to be connected to a wireless input/output module when the monitoring result indicates that the wired input/output module is not connected to the host computer. According to the present invention, an extended interface can be provided to the host computer in either of a wireless way and a wired way.

U.S. Pat. No. 8,098,488 to Lewandowski, et al. issued Jan. 17, 2012 and entitled "Computer Docking Station for a Vehicle" discloses a computer docking station for supporting and electrically coupling to a portable computer that has a docking connector includes a body having a support portion configured to support the portable computer, and a main connector moveable relative to the body between an engaged position in which the main connector is engageable with the docking connector, and a disengaged position. The computer docking station also includes a frame coupled to the body and the main connector. The frame is movable relative to the body between a first position, in which the main connector is in the disengaged position, and a second position, in which the main connector is in the engaged position. The computer docking station further includes a subframe coupled to the frame. The subframe is movable with the frame from the first position to the second position and is movable relative to the frame from the second position to a third position to inhibit movement of the main connector away from the engaged position.

U.S. Pat. No. 8,127,155 to Baarman, et al. issued Feb. 28, 2012 and entitled "Wireless Power Adapter for Computer" discloses A wireless power adapter that mounts to the docking station port of a portable computer, such as a laptop computer, notebook computer or tablet computer. The wireless power adapter includes a docking port electrical connector selected to interface with the pre-existing docking port electrical connector on the portable computer. The adapter docking port electrical connector includes power pins to connect with the pre-existing power pins of the portable computer docking port electrical connector. The wireless power adapter may include an inductive secondary to wirelessly receive power from an inductive primary. The wireless power adapter may include a mechanical connector that interfaces with the pre-existing docking station mechanical connector on the portable computer. The present invention may also include a remote inductive power supply having a base adapted to support the laptop and adapter combination. The base may includes inductive power supply circuitry and an inductive primary to produce an inductive field to wirelessly provide power to the adapter and ultimately the portable computer. The remote inductive power supply may alternatively be embedded within a work surface, such as a desktop.

U.S. Pat. No. 8,182,426 to Zhao, et al. issued May 22, 2012 and entitled "Docking Station and Ultrasonic Diagnostic System" discloses an ultrasonic diagnostic system having a tablet type electronic device for ultrasonic diagnosis and a docking station for mounting thereto the electronic device removably. The docking station includes a receptacle section against which one side of the electronic device comes into abutment when mounting the electronic device, and a hold-down section for holding down the electronic device releasably on the side opposite to the one side when mounting the electronic device.

1. Field of the Invention

The field of the invention includes tablet computers and their associated docking stations.

2. Description of Related Art

Tablet Computers

One of the latest and most popular computer form is that of a touch screen tablet (e.g. the Apple™ Ipad™). A computer tablet does not have a physical keyboard for the user to interface with the tablet. Instead, the image of a traditional QWERTY style keyboard is displayed on the touch screen. The user merely touches the letters on this virtual keyboard to interface with the tablet. But, if a user does desire the physical keyboard, there exists physical QWERTY style keyboards that are adapted to interface with the computer tablet (e.g. ASUS Keyboard Docking Station http://usa.asus.com/Tablet/Transformer_Pad/Ee-e_Pad_Transformer_TF101/)

Previous computer tablets have no distinct portions that allow the user to grip the tablet. Tablet computers, being designed to be held by a user, are susceptible to being dropped. Users have previously overcome this difficulty by purchasing one of a variety of available cases that attach to the tablet. These cases almost invariably have a greater coefficient of friction than the actual tablet, which assists the user from having the tablet sheer through his fingers.

Docking Stations

As is well known in the prior art, when the tablet computer is operably connected to the docking station, the docking station provides the user a physical keyboard to interface with the tablet computer. Furthermore, the docking station also provides power to recharges the battery of the tablet computer. The docking station can be powered by either a battery or conventional AC power. Also, some docking stations include a printer. Incorporating a keyboard, printer and power source is readily apparent to one normally skilled in the art.

BRIEF SUMMARY OF THE INVENTION

In a first aspect of the invention a docking system is disclosed. In one embodiment, the docking system is for a tablet computer and comprises: a docking station with a recess formed to accept a portion of a tablet computer; a tablet computer with a cross-section along one of said tablet computer's edges that is different from the cross-section of the other edges of said tablet computer; and a keyboard wirelessly connected to said docking station and said tablet computer.

In one variant of the docking system a portion of a cross-section along one of the tablet computer's edges is circular.

In another variant, the tablet computer is stably at rest in the docking station at a first angle and at a second angle.

In still another variant, the docking station comprises a printer.

In still another variant, the docking station has a plurality of electrical connectors within its recess.

In still another variant, the tablet computer has a different plurality of electrical connectors contacting the plurality of electrical connectors within the recess.

In still yet another variant, The plurality of electrical connectors on the tablet computer and the plurality of electrical connectors in the recess remain in contact at a first angle between the computer tablet and docking station and at a second angle between the computer tablet and docking station.

BRIEF DESCRIPTION OF THE DRAWINGS

The features, objectives, and advantages of the invention will become more apparent from the detailed description set forth below when taken in conjunction with the drawings, wherein:

FIG. 1.A. is a bottom view of the computer tablet this is subject of the present invention.

FIG. 1.B. is a top view of the computer tablet that is subject of the present invention.

FIG. 1.C. is a right side view of the computer tablet that is subject of the present invention.

FIG. 1.D. is a left side view of the computer tablet that is subject of the present invention.

FIG. 1.E. is a front view of the computer tablet that is subject of the present invention.

FIG. 1.F. is a right side view close up of the bottom of the computer tablet this is subject of the present invention.

FIG. 1.G. is a left side view close up of the bottom of the computer tablet this is subject of the present invention.

FIG. 1.H. is the back view of the computer tablet that is subject of the present invention.

FIG. 1.I is the back view of the computer tablet that is subject of the present invention with the display kickstand extended.

FIG. 1.J. is a front view of the computer tablet this is subject of the present invention with the stylus removed from the computer tablet.

FIG. 2.B. is a front view of the docking station that is subject of the present invention.

FIG. 2.C. is a side view of the docking station that is subject of the present invention.

FIG. 2.D. is a cross-sectional view of the docking station that is subject of the present invention.

FIG. 2.E. is a back view of the docking station that is subject of the present invention with the printer paper feed door opened.

Figure 1:
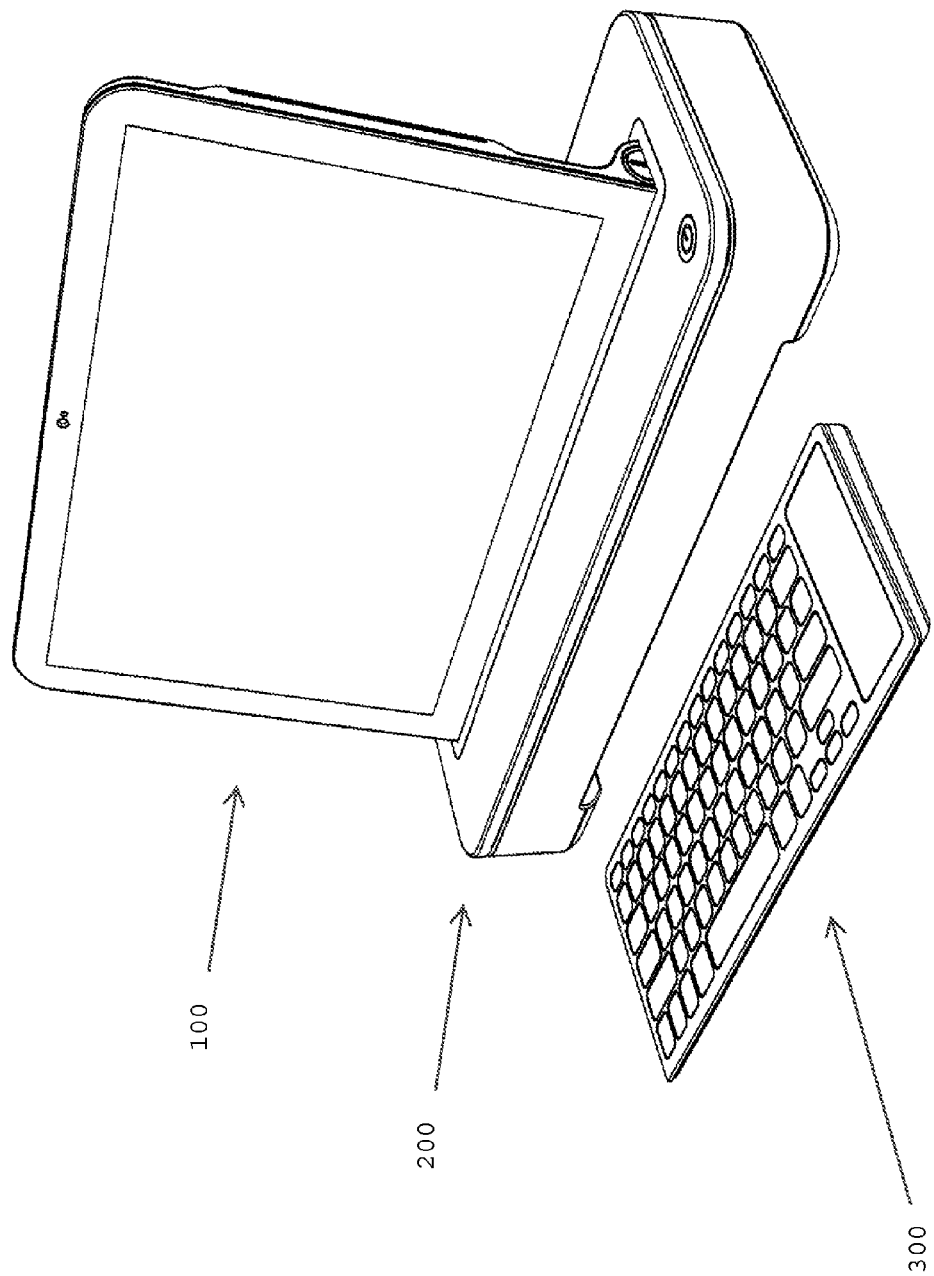
FIG. 1 is a graphic representation of the present invention showing the tablet computer, the docking station and a recessed computer keyboard.

Other features and advantages of the present invention will immediately be recognized by persons of ordinary skill in the art with reference to the attached drawings and detailed description of exemplary embodiments as given below.

DETAILED DESCRIPTION OF THE INVENTION

Reference is now made to the drawings wherein like numerals refer to like parts throughout.

As used herein, the term "Bluetooth" refers without limitation to any device, software, interface or technique that complies with one or more of the Bluetooth technical standards, including Bluetooth Core Specification Version 1.1 (ratified as IEEE Standard 802.15.1-2002) Version 1.2 (ratified as IEEE Standard 802.15.1-2005), Version 2.0, and Version 2.1+ EDR, each of the foregoing being incorporated herein by reference in its entirety, and any subsequent versions thereof.

As used herein, the term "computer program" or "software" is meant to include any sequence or human or machine cognizable steps which perform a function. Such program may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Binary Runtime Environment (BREW), and the like.

As used herein, the term "memory" includes any type of integrated circuit or other storage device adapted for storing digital data including, without limitation, ROM. PROM, EEPROM, DRAM, SDRAM, DDR/2 SDRAM, EDO/FPMS, RLDRAM, SRAM, "flash" memory (e.g., NAND/NOR), and PSRAM.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the terms "network" and "bearer network" refer generally to any type of data, telecommunications or other network including, without limitation, data networks (including MANs, PANs, WANs, LANs, WLANs, micronets, piconets, internets, and intranets), hybrid fiber coax (HFC) networks, satellite networks, cellular networks, and telco networks. Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, 802.11, 802.20, ATM, X.25, Frame Relay, 3GPP, 3GPP2, WAP, SIP, UDP, FTP, RTP/RTCP, H.323, etc.).

As used herein, the term "network interface" refers to any signal, data, or software interface with a component, network or process including, without limitation, those of the FireWire (e.g., FW400, FW800, etc.), USB (e.g., USB2), Ethernet (e.g., 10/100, 10/100/1000 (Gigabit Ethernet), 10-Gig-E, etc.), MoCA, Serial ATA (e.g., SATA, e-SATA, SATAII), Ultra-ATA/DMA, Coaxsys (e.g., TVnet™), radio frequency tuner (e.g., in-band or OOB, cable modem, etc.), Wi-Fi (802.11a,b,g,n), WiMAX (802.16), PAN (802.15), or IrDA families.

As used herein, the term "USB" refers to a serial bus standard to interface devices to a host computer without limitation to USB 0.7, USB 0.8, USB 0.9, USB 1.0 (Full-Speed USB), USB 1.1, USB 2.0 (Hi-Speed USB), USB 3.0 (SuperSpeed USB), and wireless USB Specification Rev 1.0 each of the foregoing being incorporated herein by reference in its entirety, and any subsequent versions thereof.

As used herein, the term "Wi-Fi" refers to, without limitation, any of the variants of ANSI/IEEE-Std. 802.11 ("Information technology—Telecommunications and information exchange between systems—Local and metropolitan area networks—Specific requirements—Part 11: Wireless LAN Medium Access Control (MAC) and Physical Layer (PHY) Specifications") or related standards including 802.11a/b/e/g/n/y, each of the foregoing being incorporated herein by reference in its entirety.

As used herein, the term "wireless" means any wireless signal, data, communication, or other interface including without limitation Wi-Fi™, Bluetooth™, 3G, HSDPA/HSUPA, TDMA, CDMA (e.g., IS-95A, WCDMA, etc.), FHSS, DSSS, GSM, PAN/802.15, WiMAX (802.16), MWBA (802.20), narrowband/FDMA, OFDM, PCS/DCS, analog cellular, CDPD, satellite systems, millimeter wave or microwave systems, acoustic, and infrared (i.e., IrDA).

Overview

The preferred embodiment of the disclosed invention provides for an asymmetrical configuration of the frame of a tablet computer. One of the lengths of the tablet computer's frame has a different cross section than the other sides. The asymmetric geometry of the tablet frame creates at least two distinctive advantages over prior art.

The increased cross section can be used as a hand grip for the user when the user is carrying the tablet computer. Furthermore, the mass in the increased cross section shifts the center of gravity of the computer tablet from the geographical center of the computer tablet. This feature provides greater stability to the tablet computer when docked in the docking station.

The computer tablet cross-section is coordinated with the geometry of the recess of the docking station. The docking station cradles the computer tablet. In one embodiment, the outer radius of the tablet frame is the same as the inner radius of the of the docking station cradle. While resting in the cradle of the docking station, the tablet can be adjusted through a variety of viewing angles to accommodate the individual user's preferred viewing angle. In another embodiment, the increased cross-section has sprockets and the cradle of the docking station has a series of indentations designed to accept the sprockets. As such, the viewing angles available are predetermined and not continuous. In yet another embodiment, the increased cross-section can be that of a hexagon, decagon, or other similar polygon shape; the geometry of the recess is correspondingly adjusted to accommodate those cross-sections.

While resting in the cradle of the docking station, the tablet is operationally and electrically connected to the docking station. These connections are located and sized to allow the tablet and the docking station to maintain electrical connectivity through out the various angles at which the tablet can rest in the docking station cradle.

Detailed Description of the Exemplary Embodiments

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

FIG. 1. shows the tablet computer 100 docked in the docking station 200, and the physical QWERTY style keyboard 300. FIG. 1.A. is the bottom of the computer tablet. The tablet computer has a microprocessor and memory inside it making it capable of running computer programs. The tablet computer also has wireless communication capability. The tablet computer has Electrical connections 102 located along the outside of the tablet. These connections allow for the tablet computer to electrically interface with the docking station. Due to the length and placement of the connections, the tablet computer can maintain the electrical connection with the docking station at a variety of angles. Another electrical connection 104 allows the tablet computer to be charged via a cable plugged into a wall outlet or connected to a computer via a USB port. FIG. 1.B is the top down view of the computer tablet 100.

FIG. 1.C and FIG. 1.D. most readily show the asymmetric cross section of the computer tablet. In this preferred embodiment the bottom edge of the computer tablet has a circular cross section. The diameter of the circular cross section is greater in length than the thickness of the computer tablet 100. FIG. 1.E is a front view of the computer tablet 100.

FIG. 1.F is a close-up view of the asymmetrical portion of the computer tablet. The increased volume of the asymmetric portion of the computer table is adapted to house a stylus 106. The other side of the asymmetric portion of the computer table shown in FIG. 1.G has a threaded cap 108 which allows the user to access a battery that powers the computer tablet.

FIGS. 1.H and 1.I show that the computer tablet 100 has a retractable stand 110. FIG. 1.H shows the stand refracted where FIG. 1.I shows the retractable stand extended to allow the computer tablet to be set on a desk or other surface for viewing.

Figure 2E:
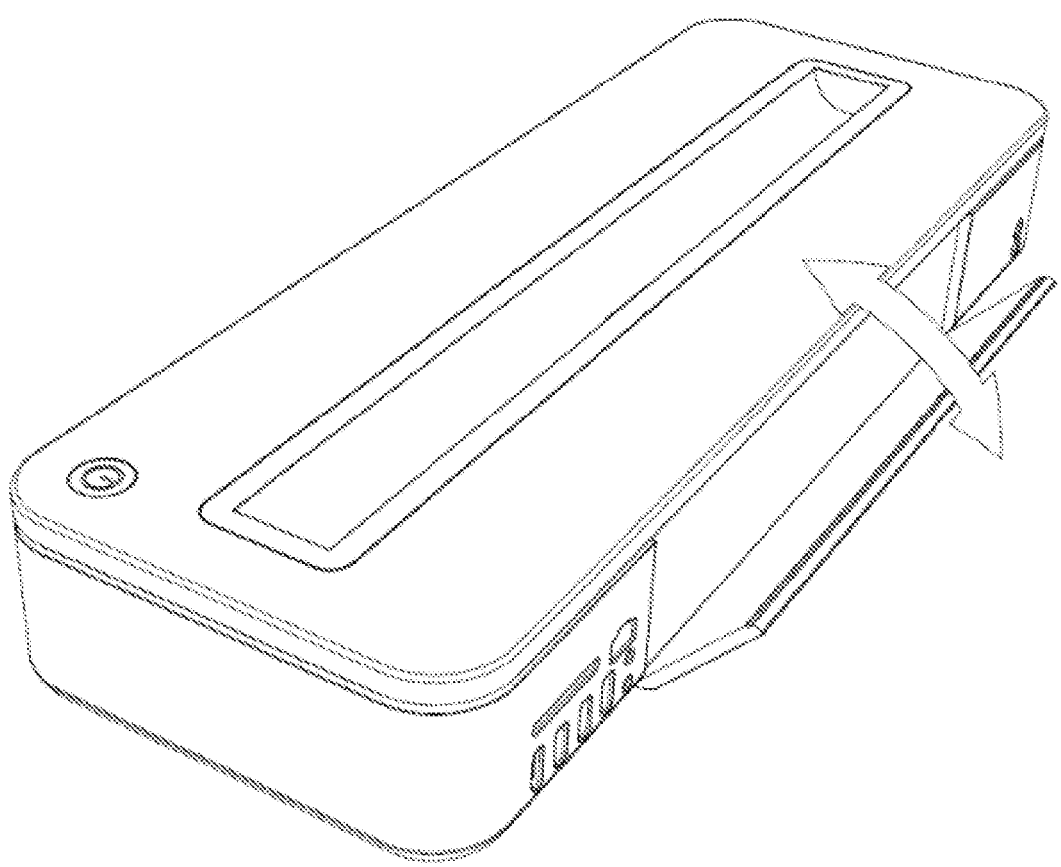
FIG. 2.A. is a top down view of the docking station that is subject of the present invention.

FIGS. 2.A, 2.B, and 2.C are the docking station 200 from various angles. There is a power button 202 located on the top of the docking station. The computer tablet 100 communicates with the docking station 200 via WiFi or Bluetooth technology. The interface between items using these two technologies is readily apparent to one skilled in the art. Furthermore, when the computer tablet 100 rests in the cradle 204 of the docking station 200, the electrical connectors 102 connect to the electrical interfaces 206.

FIG. 2.D is a cross section of the docking station 200 showing a circular cross section of the cradle 204. The preferred embodiment of the cradle cross section is circular, but need not be. In another embodiment of the invention, the cradle cross section is half of a polygon configuration that corresponds to a polygon configuration of the asymmetrical portion of the computer tablet. There is a portion of space inside 206 the docking station 200 which allows for the physical QWERTY keyboard 300 to be recessed when not in use. The physical QWERTY keyboard 300 is wirelessly connected to the docking station 200 and computer tablet via Bluetooth connection.

It should be noted that the docking station disclosed herein may be configured to incorporate accessories such as speaker(s), clock(s), wireless router(s), and other accessories that may complement or be necessary for the operation of the docking system.

What is claimed is:

1. A tablet computer with a cross-section along one of said tablet computer's edges that is substantially greater than all cross-sections of the other edges of said tablet computer, such that it shifts the center of gravity of said tablet computer away from its geographical center and toward said tablet computer's edge having said substantially greater cross-section, such that to provide increased stability of said tablet computer when at least a portion of said tablet computer's edge having said substantially greater cross-section sits on a resting surface.

2. The tablet computer of claim 1, wherein the substantially greater cross-section has a shape that is substantially circular such that to enable smooth rotation of the tablet computer about a longitudinal axis of the edge having the substantially greater cross-section when the tablet computer is adjusted by a user through a plurality of preferred viewing angles with respect to the resting surface.

3. The tablet computer of claim 2, wherein said shape is configured to provide a projection extending substantially perpendicularly to said tablet computer's back surface.

4. The tablet computer of claim 3, wherein the projection is configured for use as a hand grip by the user to prevent slip from said user's hand when the user is carrying said tablet computer in the user's hand.

5. The tablet computer of claim 2, wherein the shape of said tablet computer's edge having said substantially greater cross-section has a plurality of sprockets and is configured to fit closely into a recess portion of a docking station.

6. The tablet computer of claim 1, wherein the substantially greater cross-section has a polygonal shape.

7. The tablet computer of claim 5, wherein said edge having said substantially greater cross-section comprises a first plurality of electrical connectors configured to maintain electrical contact with a corresponding second plurality of electrical connectors of said docking station.

* * * * *